United States Patent [19]

Jannot et al.

[11] Patent Number: 4,857,704
[45] Date of Patent: Aug. 15, 1989

[54] APPARATUS FOR THERMAL TREATMENTS OF THIN PARTS SUCH AS SILICON WAFERS

[75] Inventors: Marcel A. J. Jannot, Sarcelles; Jean-Pierre Patureau, Marly le Roi, both of France

[73] Assignee: Bertin & Cie, Cedex, France

[21] Appl. No.: 123,858

[22] PCT Filed: Feb. 18, 1987

[86] PCT No.: PCT/FR87/00043
§ 371 Date: Dec. 14, 1987
§ 102(e) Date: Dec. 14, 1987

[87] PCT Pub. No.: WO87/05054
PCT Pub. Date: Aug. 27, 1987

[30] Foreign Application Priority Data

Feb. 19, 1986 [FR] France .................. 86 02239

[51] Int. Cl.4 .................................. H05B 3/62
[52] U.S. Cl. ........................ 219/354; 219/405; 219/411
[58] Field of Search ........... 219/354, 405, 411, 390, 219/343; 118/725, 728, 729, 730, 50.1

[56] References Cited

U.S. PATENT DOCUMENTS

| | | | |
|---|---|---|---|
| 3,627,590 | 12/1971 | Mammel | 148/1.5 |
| 4,041,278 | 8/1977 | Boah | 219/354 |
| 4,101,759 | 7/1978 | Anthony | 219/405 |
| 4,221,956 | 9/1980 | Fielding | 219/411 |
| 4,493,977 | 1/1985 | Arai | 219/354 |
| 4,535,228 | 8/1985 | Mimura | 219/405 |
| 4,539,933 | 9/1985 | Campbell | 118/725 |
| 4,649,261 | 3/1987 | Sheets | 219/405 |

FOREIGN PATENT DOCUMENTS

| | | |
|---|---|---|
| 3136105 | 4/1982 | Fed. Rep. of Germany . |
| 2207757 | 6/1974 | France . |
| 2065973 | 7/1981 | United Kingdom . |
| 2083728 | 3/1982 | United Kingdom . |

OTHER PUBLICATIONS

Juh Tzeng Lue, "Arc Annealing . . . Flash Lamp", App. Physics Letters, vol. 36, Jan. 1, 1980.

Primary Examiner—Teresa J. Walberg
Attorney, Agent, or Firm—Bell, Seltzer, Park & Gibson

[57] ABSTRACT

An apparatus for the thermal treatment of a thin part (1) includes a thermal light source including linear lamps (17) of very high unitary power such as "tungsten-halogen" lamps, and a housing (2) containing the part to be treated. The apparatus includes inside the housing (2) a chamber (4) delimited by the sidewall and the bottom (3a) of the housing as well as by a silica window, making it possible to create about the part to be treated particular conditions for thermal treatment. Within the treatment chamber there is arranged a compensation means (22a) for the thermal losses of the part to be treated. The thermal light source is configured like a light box (16a) by superimposing several modules (43) having a polygonal cross-section.

19 Claims, 2 Drawing Sheets

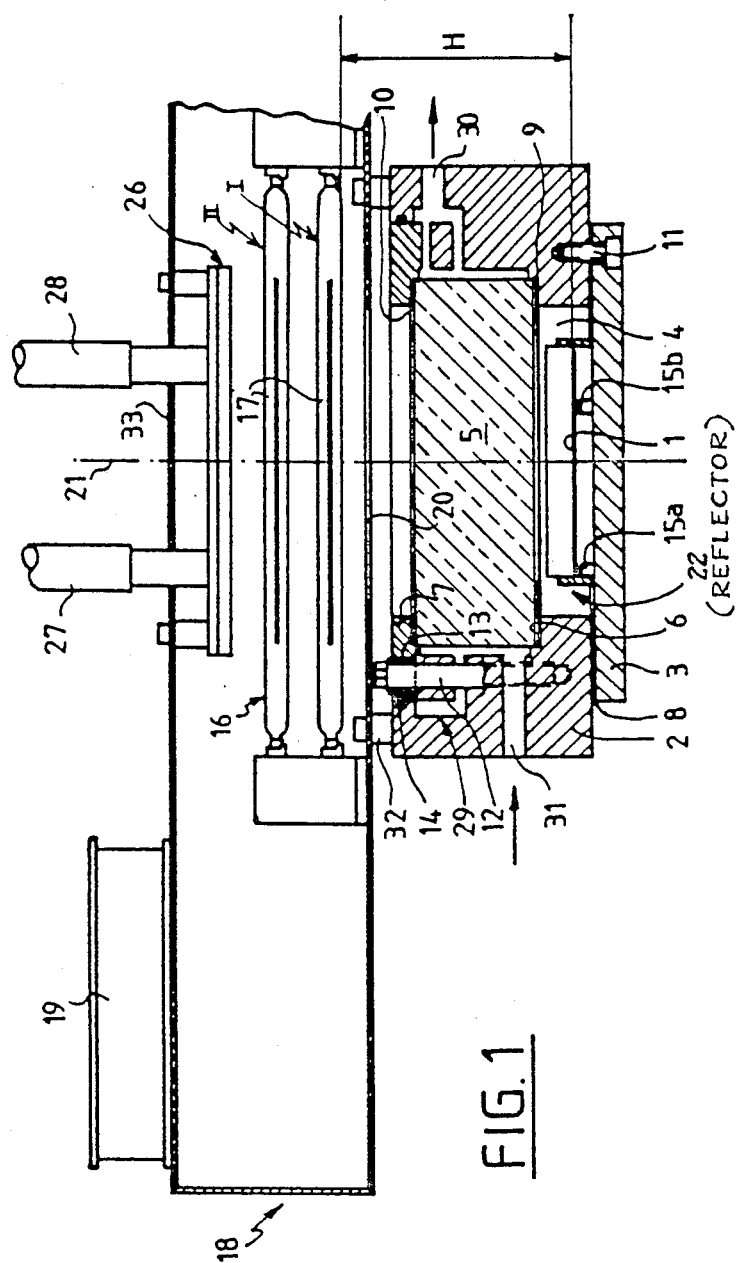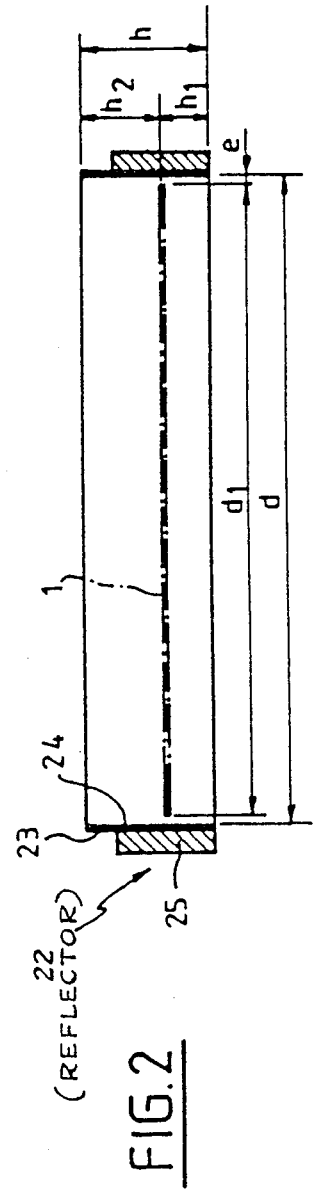

APPARATUS FOR THERMAL TREATMENTS OF THIN PARTS SUCH AS SILICON WAFERS

The present invention relates to an apparatus for thermal treatments of thin parts, such as silicon platelets, usually called "wafers" in accordance with the Anglo-Saxon terminology, and used in the micro-electronic field.

In this type of treatment, light sources are often used as thermal source because of the practically inexistant thermal inertia of this type of source which thus makes possible an optimum control of the thermal cycle, for example, by better mastering certain aspects of solid/-solid heat exchangers.

It is a question of very high power light sources, because of the levels and temperature rise times which it is desirable to attain in this type of thermal treatment.

Now, the need to obtain temperatures uniformly distributed to the parts to be treated - which is imperative for limiting the thermomechanical stresses and the consequent defects in these parts - raises very delicate problems of implementation.

One means used for this purpose consists in generating a beam of parallel light rays using for example a parabolic mirror having the size of the part to be treated. That involves the use of a pin point light source disposed at the focal point of the mirror, namely an arc lamp whose very high cost, difficulty in use and short lifespan considerably limit the industrial applications.

There also exist thermal treatment apparatus using linear light sources, whose cost and ease of use are incomparably more interesting than the case of arc lamps: it is a question generally of so called "tungsten-halogen" lamps, namely, incandescent lamps with tungsten filament and halogens, these latter being used for reducing the blackening of the bulb or tube which contains the filament, cf. in particular the review SEMICONDUCTOR INTERNATIONAL/79, N: of May 1985.

However, in this type of apparatus, the uniformity of the temperatures is obtained by disposing the "tungsten-halogen" lamps in the vicinity of these parts, which limits the thermal treatments which may be carried out thereon to ambient pressure treatments, such as annealing for example.

The purpose of the present invention is consequently to provide an apparatus for thermal treatments of thin parts, such as silicon wafers, of the type using very high power linear lamps as thermal source, such as "tungsten-halogen" lamps, which answer better the requirements of practice than the apparatus relating to the same purpose, known in the prior art, particularly in that thermal treatments can be carried out other than annealing at ambient temperature and, generally, any treatment requiring the creation of particular ambient conditions about the parts to be treated, for example under pressure or in a vacuum, while ensuring the required uniformity of the temperatures of the parts.

The present invention has as object an apparatus for the thermal treatment of at least one thin part, such as a silicon wafer, comprising a thermal light source including linear lamps of very high unitary power, such as "tungsten-halogen" lamps, and a housing containing the part or the parts to be treated and whose geometric axis of symmetry coincides with the optical axis of symmetry of said thermal light source, which apparatus is characterized in that it includes inside the housing, which has a circular symmetry, a chamber making it possible to create about the part or parts to be treated particular thermal treatment conditions, particularly under pressure or in a vacuum and in an atmosphere of an appropriate gas, which treatment chamber has its geometrical axis of symmetry coinciding with said optical axis of symmetry and comprises means ensuring sealing with respect to the housing which contains it, and in that in the treatment chamber is disposed a compensation means for the thermal losses of the part or parts to be treated, namely losses through the faces and small side wall (surface or axial losses) and end or radial losses of this part or of these parts, thus making it possible to maintain its temperature or their temperature substantially uniform.

In another preferred embodiment of the apapratus of the invention, the means for compensating the thermal losses through the peripheral surface of the part or parts to be treated is formed by an annular reflector placed in the confinement volume surrounding the part or parts, the internal diameter and the height of this annular reflector being chosen so that there is no partial occultation of the source whatever the surface element of the part or parts to be treated.

In a preferred arrangement of this embodiment, the thermal compensation reflector is formed by a solid toroidal part, whose internal face is gold coated and which is fixed to the internal wall of the housing by any appropriate means, particularly by screwing, so as to ensure an intimate contact between the internal wall of the housing and the external face of the massive toroidal part.

In an advantageous mode of this arrangement, a coaxial toroidal groove is formed at the periphery of the wall of the solid toroidal part, which groove communicates with radial distributing orifices allowing at least one appropriate gas creating a controlled atmosphere to be introduced into the treatment chamber.

In an advantageous arrangement of this embodiment, said thermal compensation reflector is formed by a foil which is gold coated on its internal face and whose annular configuration is obtained by rolling and is maintained by clamping by means of a non corrodible ring of appropriate thickness.

In another advantageous arrangement of this embodiment, the part or parts to be treated is or are held in position by support and centering means with respect to the thermal compensation reflector.

In an advantageous mode of this arrangement, the support and centering means is formed by three domed studs embedded in the bottom of the housing and making it possible to reduce to a minimum the contact with the part or parts to be treated and so to influence as little as possible the thermal exchanges thereof, each stud cooperating with a lateral centering stop means projecting upwardly from the external lateral wall of the stud.

In an advantageous embodiment of the apparatus of the invention, the treatment chamber comprises a means of access to this chamber and is defined by the side wall and the bottom of the housing as well as by a cylindrical window, made from silica and entirely polished, having an appropriate diameter and thickness and being interposed between the source and the part or parts to be treated and whose axis coincides with the optical axis of the source and the axis of the housing, the side wall of the housing including a seat on which the window bears, this latter being held in position by means of a fixing flange which clamps the window against its seat by means of a plurality of screws made from a material having a practically negligible thermal expansion coefficient, between said seat and the window and this latter and the fixing flange there is disposed, respectively, a seal made from an appropriate material such as expanded graphite.

In a preferred arrangement of this embodiment, said means of access to the treatment chamber is formed by the bottom itself, which bottom cooperates with rapid opening and closing means, thus making an increase of the operating rates possible and formed by the mobile plate of a press with which the bottom of the housing is integrally secured, the fixed plate (or bed) of the press being integrally secured with the upper part of the housing by means of rigid columns, sealing at the housing/bottom interface being provided by the cooperation of the following means:

- an annular rib projecting from one or other of the housing/bottom separation surfaces and to which the pressing force is transmitted through said columns,
- a toroidal cavity disposed outside said annular rib and intended for recovering possible gas leaks, the cavity being connected for this to a recovery circuit under a depression,
- a seal made from an appropriate material, such as expanded graphite, disposed outside this toroidal cavity.

In an advantageous arrangement of this embodiment, said access means to the treatment chamber is formed by the very bottom of said housing, which bottom is removable and fixed to the base of the housing by means of movable fixing means.

In an advantageous mode of this arrangement, the means for detachably fixing the bottom to the base of the housing are formed by a plurality of screws made from a material having a practically negligible thermal expansion coefficient, a seal made from an appropriate material, such as expanded graphite, being disposed between said bottom and said enclosure.

In a preferred embodiment of the apparatus of the invention, said thermal light source is in the form of a light box having a modular structure making it psosible to adapt the installed power to the power required for treatment of the part and comprising:

- at least one hollow module with polygonal section, defined by lateral and vertical metal walls, parallel to and in the vicinity of each wall there being disposed horizontally parallel rows of linear "tungsten-halogen" lamps which pass through the two adjacent walls of the module so that the bases of the lamps are disposed outside the module and cooling thereof, particularly by forced ventilation, is efficient, two consecutive lamps in each row being separated by an appropriate pitch (or distance) allowing a lamp to pass therebetween belonging to each of the two adjacent rows of lamps, the width of each one being defined by the useful (or active) dimension of each lamp, namely by the length of the tungsten filament,
- a metal element for closing the upper opening of at least said module or of the module situated the highest among a plurality of modules of the same type superimposed one on the other whose number depends on the power required by the thermal treatment, which element forms the lid or ceiling of the light box, the internal faces of the side walls and of the ceiling of the light box being reflecting throughout the emission spectrum of the lamps and each module being cooled by circulation of an appropriate fluid, particularly water.

In an advantageous arrangement of this embodiment, the ceiling of the light box also cooperates with a row of linear "tungsten-halogen" lamps disposed horizontally and parallel to said ceiling.

In another advantageous arrangement of this embodiment, a connecting flange connects the lower module of the light box to the housing, thus making it possible to pass from the polygonal section of the module to the circular section of the housing, the internal wall of the connecting flange being also reflecting throughout the whole emission spectrum of the lamps.

In another advantageous embodiment of the apparatus of the invention, said source is formed by several parallel rows (or layers) of "tungsten-halogen" lamps, two consecutive lamps in each row being separated by an appropriate pitch (or distance) and the rows being offset by a half pitch and being disposed at an appropriate distance from each other, the light source thus formed being housed in a metal sheet cowling, to which said housing is fixed by any appropriate means and which is cooled by fans, and cooperating with a gold plated reflector, housed in said cowling, which is intended to improve its light efficiency and is disposed above and about this source so that its axis coincides with the optical axis thereof, this reflector being cooled by circulation of an appropriate fluid, particularly water.

In another advantageous embodiment of the apparatus of the invention, this latter comprises means for adjusting the power of each module, formed particularly by switching devices and/or devices for varying the supply voltage of the lamps, which adjustment means are controlled by a pyrometric probe activated by the radiation coming from the lower face of the part to be treated, and under the control of a computer programmed for compensating for any undesirable variation in the installed power as well as for adapting the thermal treatment to a well defined cycle.

In an advantageous arrangement of this embodiment, the radiation activating the pyrometric probe propagates through:

- a first axial duct formed in the bottom of the housing and opening upwardly into the treatment chamber,
- a window for sighting the lower face of the part to be treated, disposed following and at the lower part of this axial duct, whose axis is aligned with that of the sighting window,
- a prism housed in an added part, in its turn housed in the bottom of the housing, the radiation being directed from the sighting window towards this prism by second axial duct formed in said added part,
- an optical fiber disposed at 90° with respect to the axis of the thermal treatment chamber, the radiation being directed from the prism towards the optical fiber through a transverse duct perpendicular to said second axial duct and formed, like this latter, in said added piece.

In an advantageous embodiment of the apparatus of the invention, this latter includes thermal conditioning means for limiting the temperature rise of the window and formed by a circuit through which passes an appropriate thermostatic controlled fluid, formed particularly by oil coming from a thermostatic controlled bath, and including conditioning jackets formed in the housing, at the periphery of the window and around screws clamping said fixing flange.

In another advantageous embodiment of the apparatus of the invention, the bottom of the housing includes thermal conditioning means of the type used for the housing, namely formed by a circuit through which passes an appropriate thermostatic controlled fluid, such as oil, coming from a thermostat controlled bath, and including a conditioning jacket formed in the bottom of the housing.

In addition to the preceding arrangements, the invention further includes other arrangements which will be clear from the following description.

The invention will be better understood from the complement of description which follows with reference to the accompanying drawings in which:

FIG. 1 is a schematical sectional view with parts cut away showing a non limitative embodiment of the apparatus of the invention;

FIG. 2 is a view also in section of the thermal compensation reflector of the invention, which has been shown on a larger scale than that used in FIG. 1;

Figure 3:
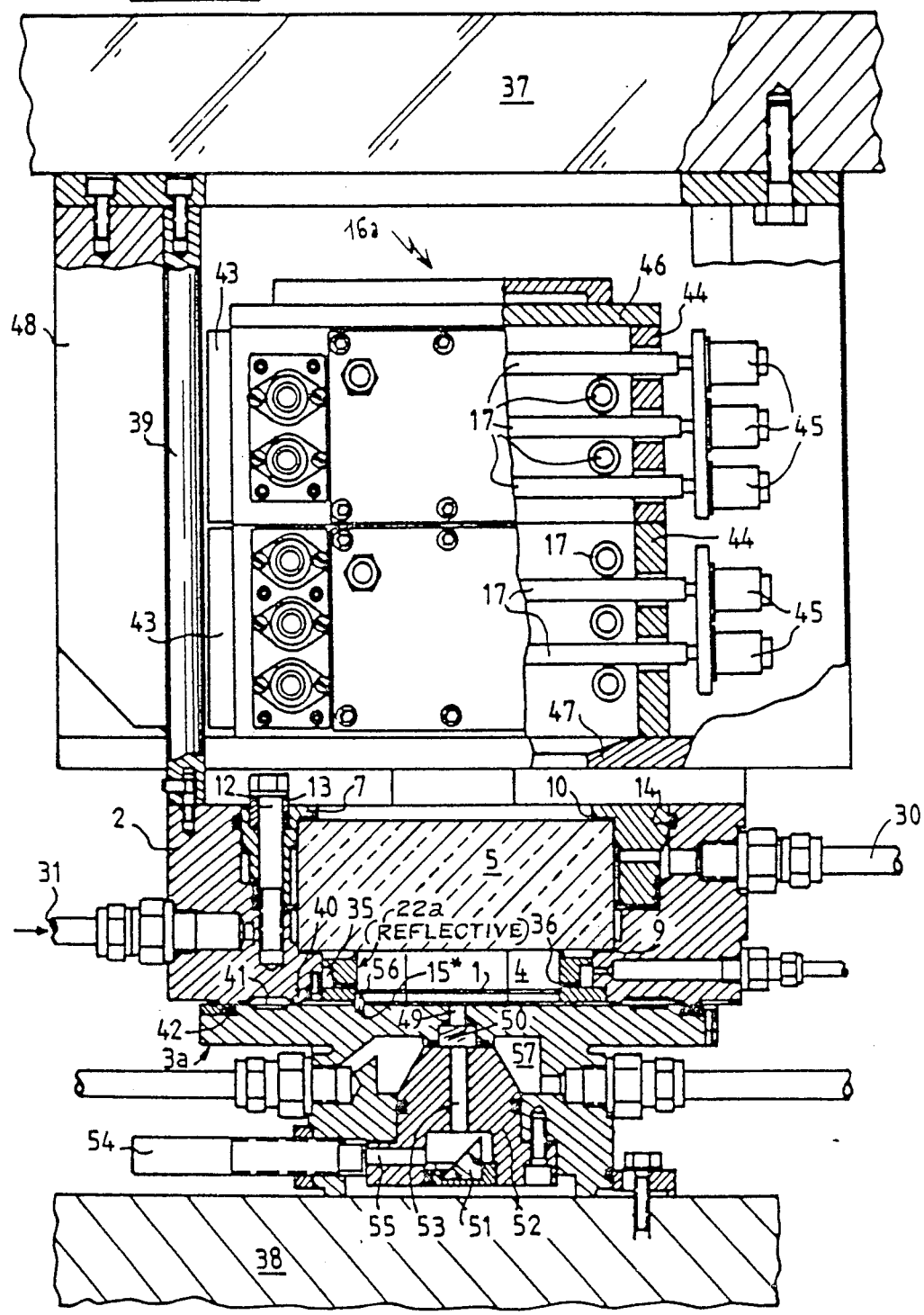
FIG. 3 is a sectional view of a variant of the apparatus of the invention.

It must however be understood that these drawings and the corresponding descriptive parts are given solely by way of illustration of the object of the invention, of which they in no wise form a limitation. The apparatus illustrated in FIG. 1 is intended for carrying out thermal treatments of a thin part 1, such as a silicon wafer for example, which is contained in a housing (or oven properly speaking) 2 which is formed of a cylindrical stainless steel casing (drum) having a means of access to the oven which is formed by a solid stainless steel plate 3 closing the base of the housing and clamped by 16 screws (only one screw 11 of which has been shown for the sake of simplicity).

The upper face of plate 3, namely the face which is oriented towards the inside of oven 2, is polished and then treated with a gold deposit and with a protective layer, this treatment making it possible to obtain a very good reflectivity from 0.7 m to the far infrared, namely practically throughout the whole emission spectrum of the lamps used.

Sealing with respect to the base of the enclosure 2 is obtained by means of an expanded graphite seal 8 (for example made from "CEFILAC", which is a trademark).

In accordance with the invention, in drum 2 there is formed a chamber 4 defined by the side wall and the bottom 3 of the housing in cooperation with the cylindrical entirely silica window 5, whose diameter (in the example shown) is 160 mm and the thickness 55 mm.

The window bears on an annular seat 6 formed in the side wall of the oven and is held in position by means of a clamping flange 7: still limitatively to the example illustrated, the clamping source is obtained by 16 screws (only one screw 12 of which has been shown, and this also for the sake of simplicity).

Sealing of window 5 with respect to seat 6 of housing 2 and to the fixing flange 7 is obtained, respectively, by means of two other seals 9 and 10 made from expanded graphite identical to seal 8 used between plate 3 and drum 2.

In so far as the clamping screws 11 and 12 are concerned, they are made from "INVAR", namely a steel/- nickel alloy whose expansion coefficient is practically negligible, for the sake of stability of clamping during temperature variations.

Copper sockets 13 under the heads of each clamping screw provide sealing and adaptation of expansion.

A "viton" seal 14 between the clamping flange 7 and drum 2 completes the sealing.

The part to be treated 1 is positioned and centered by means of studs 15a, 15b... with spherical dome (preferably three studs of this type are used), whose height is 6 mm in the example in question.

The treatment chamber 4 created in the drum 2 makes it possible to establish about the part to be treated 1 an appropriate ambience, for example by pressurizing or by creating a vacuum or else by creating a particular atmosphere by means of an appropriate gas or other, while allowing illumination and so heating of part 1.

The thermoconditioning of window 5, required for limiting its temperature rise, is provided in particular by a conditioning circuit 29 with circulation of oil coming from a thermostat controlled bath, conditioning jackets being formed for this purpose in enclosure 2, at the periphery of window 5 and about the clamping screws 12. It should be noted that the oil output 30 is placed in the top part, whereas the input 31 is placed in the low part.

The thermal source used in the apparatus of FIG. 1 is a light source 16 comprising linear lamps, namely extended and not pin point, such as "tungsten-halogen" lamps 17; in the non limitative example of FIG. 1, 15 lamps of this type have been used whose light body, namely the tungsten filament, has a length of the order of 160 mm and the unitary light power is 1500 watts each, which lamps are disposed in two parallel rows (or layers) I and II, which are offset by a half pitch and spaced apart by 23.5 mm, the pitch between the lamps being 16 mm.

The assembly of lamps 17 is placed in a metal sheet cowling 18 (to which is fixed the housing 2, cf. the reference 32 in FIG. 1), which is cooled by two fans (only a single fan 19 of which is visible in FIG. 1): the cooling circuit for the lamps is designed so that the fans are not submitted to the direct radiation and so that the fresh air arrives first of all at the level of the bases of the lamps and then follows the tubes of the lamps.

The air outlet (not shown) takes place laterally at the level of the lamps protecting the top of drum 2 and the clamping flange 7 from the light flux. In the example shown, a total air flow of the order of 1301/sec is provided. An opening 20 is formed in the cowling 18 opposite window 5 and the part to be treated 1, so as to cause their axes of symmetry to coincide with the optical axis of source 16 (this common axis is shown by the reference 21 in FIG. 1). Now, the presence of the treatment chamber 4 between part 1 and the thermal light source 16, that is to say the spacing of this light source from the part to be treated, creates considerable undesirable temperature differences between the center and the periphery of the part, whose periphery is colder, so with a temperature drop at the periphery of the part to be treated (as has been established by measurements made without the thermal compensation means of the invention, which will be described hereafter).

To compensate for the thermal losses of the silicon wafer through its faces and its side wall, namely the surface or axial losses and the end (edge) or radial losses, and for thus maintaining the temperature of the part concerned substantially uniform, in accordance with the invention a thermal compensation means is used whose purpose is to correct the temperature curve of the silicon wafer, so as to obtain a substantially uniform distribution of the temperature over its surface and at the level of its edges, and which is formed by an annular reflector placed in the confinement volume surrounding the silicon wafer.

In FIGS. 1 and 2, this reflector or thermal corrector 22 is formed by a foil 23 which is gold coated on its internal surface 24, whose annular configuration is obtained by rolling and maintained by clamping by means of a non corrodible ring 25 of appropriate thickness.

It is because of the specular reflections on the internal wall 24 of the thermal corrector 22, at the bottom of which the part to be treated 1 is placed, that a good uniformity of the temperatures may be obtained, namely a good uniformity of the "view factor") between the extended light source and each surface element of the part to be treated, using for this the heat flux intercepted by the internal reflecting wall and which would otherwise be lost. This is tantamount to saying that the internal diameter and the height of the annular reflector are chosen so that there is no partial occultation of the source whatever the surface element of the part to be treated.

Generally, the further away from the wafer to be treated, the more the height h of the thermal compensation reflector 22 increases, the internal diameter d thereof remaining very close to the diameter $d_1$ of the wafer.

In the example forming the subject of the present description, the following geometrical conditions are assumed:
the reflector 22 has a reflecting height h of 19.5 mm;
the upper surface of the silicon wafer 1 is at a distance $h_1 = 6.5$ mm from the bottom 3, namely at a distance $h_2 = 13$ mm from the top of the reflector;
the inner diameter of the reflector is 101.5 mm;
the diameter of the silicon wafer is 100 mm, so that there exists a clearance e of 0.75 mm between the reflector and the wafer.

Now, more precisely, the fact of obtaining a distribution of substantially uniform temperatures (uniform temperature "profile"), at the surface of the silicon wafer is related to the value of said parameters $h_2$ and e, for prefixed values of the diameter $d_1$ of the wafer, and of the distance H between the wafer and the extended light source 16, as well as to the thermal properties (thermal conductibility particularly) of the part to be treated.

In fact, it is possible to establish mathematical equations governing the heat exchanges between the silicon wafer and the reflector and to verify that the basic adjustment parameters for the homogeneity of the temperature of the part to be treated are formed by said parameters $h_2$ and e, namely - for a given distance $h_1$ (height of the supporting studs) and for a given wafer ($d_1$ - by the parameters h ($=h_1+h_2$) and d ($=d_1+e$) of the reflector of the invention.

It is then by adjusting these parameters that parts to be treated of different dimensions ($d_1$) and different configurations can be accomodated, namely the different positions (H) of the light source with respect to these parts.

With the above indicated values for parameters $h_2$, e and $d_1$, and assuming that the light source is at a distance $H = 75$ mm from the silicon wafer, a uniformity of temperature is obtained defined by temperature differences of the order of a few degrees between any two points at the surface of the wafer, and this for a temperature level as high as a 1000° C. and even higher, which represents a very satisfactory result and, in any case, more than sufficient for the wafer thus thermally treated to have the required qualities.

Now, considering the very high temperature levels, which it is desirable to reach in certain types of heat treatment, it is obvious that it is necessary to obtain a good light efficiency.

For this, a gold plated reflector 26 is disposed above the two rows of lamps 17, I and II, which reflects the light towards the scuttle 5 (the gold plated reflector 26 is housed in the cowling 18 and is fixed to its upper wall; in addition, this reflector is cooled by water circulation, in FIG. 1 both the water intake 27 and outlet 27 being visible, respectively, which have access in the cowling 18 to reflector 26 through an opening 33 formed in the top part of the cowling).

It goes without saying that it would be preferable to dispose such a gold plated reflector not only above the lamps, but therearound, although this arrangement has not been shown for reasons of simplicity of the drawings.

In FIG. 3, a variant of construction of the apparatus shown in FIG. 1 has been represented.

The main differences concern essentially the construction of the thermal compensation reflector (or thermal corrector), the closure bottom of the housing and the thermal light source, whereas the remarks made with respect to the description of the FIG. 1 relatively to the housing and to the scuttle, including the mutual functional relationships therebetween, remain valid.

In so far as the thermal corrector shown in FIG. 3 is concerned and shown by the reference 22a, it is of solid construction and is fixed to the internal wall of housing 2 by any appropriate means and particularly by a series of screws (of which only a single screw 34 is visible in FIG. 3, for the sake of simplicity), capable of ensuring and maintaining an intimate contact between the internal wall of the housing and the external face of the solid toroidal part 22a forming said thermal corrector, which may thus benefit from the thermal oil circulation condition of housing 2.

The solid constructional variant of the thermal corrector which has just been described is particularly advantageous when the operating temperatures are particularly high so as to avoid sublimation of the reflecting coating on the internal face of the thermal corrector or at least its deterioration.

It goes without saying that the contour (or profile) of the internal reflecting face of the thermal corrector is calculated, in general, to be adapted to the contour (or profile) of the part to be treated and that therefore the generatrix of this internal face is a priori of any kind, although in practice the most current cases are represented by configurations with cylindrical or parallelepipedic symmetry.

The introduction into the treatment chamber 4 of at least one gas for creating thereinside a controlled atmosphere, allowing a particular heat treatment condition for part 1 to be obtained, is made possible because of a toroidal groove 25 which is formed at the periphery of the solid thermal corrector 22a and which communicates with the treatment chamber 4 through a plurality of radial distributing orifices 36.

The considerations discussed in connection with FIG. 2 and relating to the height and the internal diameter of the thin thermal corrector 2 remain also valid in the case of the solid thermal corrector 2a.

FIG. 3 also shows a variant of construction of the access means to the thermal treatment chamber 4, namely of bottom 3a of housing 2, which has the double advantage of making possible an increase in the operating rates, through the cooperation with high speed opening and closing means, as well as the precise adjustment of the thermal power, through the use of a pyrometric probe, these two conditions being described in detail hereafter.

First of all, it will be noted in FIG. 3 that the apparatus of the invention cooperates with a press whose press bed 37 (or fixed plate) is rigidly fixed to housing 2 through vertical columns among which only column 39 is visible in the drawing, whereas the press plate 38 (or mobile plate) supports the bottom 3a of housing 2.

The interconnection between the press plate 38 and bottom 3a makes possible the rapid execution of the operations for closing and opening this bottom, which is advantageous, with respect to the detachable fixing means desribed in connection with FIG. 1, when the operating rates are relatively high.

In this case, the sealing at the housing/bottom interface is provided by cooperation of the following means:
- an annular rib 40, projecting more particularly from the lower face of housing 2, to which it transmits the pressing force through said columns 39 and the body of housing 2,
- a toroidal cavity 41 disposed externally of rib 40 and intended for the recovery of possible gas leaks, through a depression circuit (not shown) with which cavity 41 is in communication (this cavity is obtained by forming two toroidal grooves, opposite each other, in the faces of housing 2 and bottom 3a applied one against the other),
- an expanded graphite seal 42 disposed externally of the toroidal cavity 41 and housed more particularly in a peripheral groove formed in bottom 3a.

Before describing the means for regulating the power used in the thermal treatment, the variant of construction of the thermal light source used in the apparatus of FIG. 3 will be described.

This source is in the form of a light box 16a having a modular structure which allows the installed power to be matched to the power required by treatment of the thin part 1.

The light box 16a includes a plurality of superimposable hollow modules 43, each module having a polygonal section and being defined by vertical metal side walls 44.

In the vicinity of and parallel to each one are disposed inside the module, horizontal rows of parallel (tungsten-halogen) lamps 17 which pass through the two adjacent walls of the module so that the bases 45 of the lamps are situated outside the module, which makes it possible to cool them efficiently by forced ventilation.

It may also be noted that two consecutive lamps of each row of lamps 17 are separated by a pitch (or distance) sufficient to allow the passage therebetween of a lamp belonging to each of the two adjacent rows of lamps.

Of course, the width of each wall of the module is defined by the useful (or active) dimension of each lamp, namely by the length of its tungsten filament.

The module which has just been described, when it is used alone (or the upper module) of a stack of modules of the same type superimposed one on the other) cooperates with a metal closure element 46 forming the cover or sealing of the light box 16a thus formed.

If required, the sealing 46 may also cooperate with a row of "tungsten-halogen" lamps if the power value to be installed requires it.

In each case, the internal faces of the side walls 44 and of the ceiling 46 of each module 43 are gold plated, namely they are made reflecting throughout the whole emission spectrum of the lamps, as already mentioned above, and each module is cooled by water circulation (not shown).

Since the symmetry of the housing is circular, whereas the light box has a polygonal section (preferably having an even number of sides), a connecting flange 47 - also reflecting over the whole of its internal surface - is provided for passing from the polygonal section of the lower module of the light box 16a to the circular section of housing 2.

The light box 16a is firmly secured to the press bed 37 through a carrier structure 48 which is built about said columns 39.

Returning to the means for adjusting the installed power, and particularly the power of each module 43 of light box 16a, it should be mentioned that they are formed by devices (known per se and not shown) for switching the lamps of each module or varying the supply voltage of the lamps, which adjustment devices are controlled by a pyrometric probe (known by techniciens in the matter and not shown in the drawing of FIG. 3) which is activated by the radiation coming from the lower face of the wafer 1.

This radiation reaches the probe, situated outside the apparatus, by following the path defined by:
- an axial duct 49 formed in the bottom 3a of the housing 2 and communicating with the treatment chamber 4,
- a window 50 for sighting the lower face of the wafer 1, disposed at the lower part and following duct 49 in axial alignment therewith,
- a prism 51 housed in an added part 52, in its turn housed in the bottom 3a of housing 2, the radiation being directed from the window 50 towards this prism by a second axial duct 53 formed in the added part 52,
- an optical fiber 54, disposed at 90° with respect to the axis of the thermal treatment chamber 4, the radiation being direct from the prism 51 towards the optical fiber 54 through a transverse duct 55 perpendicular to duct 53 and formed, like this latter in the added piece 52.

In so far as the studs are concerned for supporting and centering the part to be treated 1, it should be noted that in FIG. 3 a variant 15* has been shown (a single stud has been shown for the sake of simplicity) which further comprises, with respect to studs 15a, 15b. . . of FIG. 1, a lateral centering stop 56 projecting upwardly from the external sidewall of each stud.

Furthermore, it may also be noted that studs 15* are embedded in bottom 3a, which makes the automatic lowering and raising of part 1 possible, which thus follows the movements of the press plate 38.

Although it is superfluous to emphasise it, it is evident that it is advantageous to provide also thermal conditioning of the bottom 3a of housing 2 of FIG. 3, provided in a way similar to housing 2 itself (in FIGS. 1 and 3).

For this, a thermostat controlled fluid, formed for example by oil coming from a thermostat controlled bath, flows about a conditioning jacket 57 formed in bottom 3a and connected to a conditioning circuit.

As is clear from the foregoing, the invention is in no wise limited to those of its embodiments and modes of application which have just been described more explicitly; it embraces, on the contrary, all variants thereof which may occur to a technician in the matter, without departing from the scope or spirit of the present invention: for example, although the treatment for obtaining reflecting surfaces has been indicated as including polishing and/or gold depositing operations, it is obvious that this treatment is not limitative and that, in general, any surface treatment can be used capable of making the surfaces concerned reflecting throughout the whole emission spectrum of the lamps used.

Furthermore, although a thermal light source has been described disposed on a single side of the part to be treated (wafer), nothing opposes the use of two sources of the same type disposed on this part: this is particularly easy with the embodiment illustrated in FIG. 3 where, because of the modular conception of source 16a, it is sufficient to modify housing 2 so that it can house two windows 5 disposed on each side of part 1 (by adopting the same arrangements illustrated for the single window which is shown there) and to fix to the lower part of the housing thus modified another light box 16a) whose cover would necessarily be perforated so as to allow sighting of the lower face of part 1 and so to carry out the temperature measurement by means of the pyrometric probe).

Also immediate, in any case within the scope of technicians in the matter, are the modifications made to means 3a for adapting them to the housing 2 modified as mentioned.

The advantages related to the possibility of doubling the thermal light source, in accordance with said terms, consists in the fact that, by this means, it is not only possible to effect simultaneously the treatment of two faces of part 1, but also to increase the installed thermal power and the temperature rise rate of this part.

We claim:

1. Apparatus for the thermal treatment of at least one thin part (1), comprising a thermal light source (16, 16a) including linear lamps (17) of very high unitary power, and a housing (2) containing said at least one part (1) to be treated and whose geometric axis of symmetry (21) coincides with an optical axis of symmetry (21) of said thermal light source, which apparatus is characterized in that it includes inside the housing (2), which has a circular symmetry, a chamber (4) making it possible to create, about said at least one part to be treated (1), particular heat treatment conditions, which treatment chamber has its geometrical axis of symmetry coinciding with said optical axis of symmetry and comprises means (9, 10) ensuring sealing with respect to the housing (2) which contains it, and in that in the treatment chamber is disposed a light reflecting compensation means for thermal losses of said at least one part to be treated (1) through the faces and small side wall and end or radial losses of said at least one part, thus making it possible to maintain substantially uniform temperature of said at least one part.

2. Apparatus for the thermal treatment of at least one thin part (1), comprising a thermal light source (16, 16a) including linear lamps (17) of very high unitary power, and a housing (2) containing said at least one part (1) to be treated and whose geometric axis of symmetry (21) coincides with an optical axis of symmetry (21) of said thermal light source, which apparatus is characterized in that it includes inside the housing (2), which has a circular symmetry, a chamber (4) making it possible to create, about said at least one part to be treated (1), particular heat treatment conditions, which treatment chamber has its geometrical axis of symmetry coinciding with said optical axis of symmetry and comprises means (9, 10) ensuring sealing with respect to the housing (2) which contains it, and in that in the treatment chamber is disposed a compensation means for thermal losses of said at least one part to be treated (1) through the faces and small side wall and end or radial losses of said at least one part thus making it possible to maintain substantially uniform temperature of said at least one part further characterized in that the compensating means for thermal losses through the peripheral surface of the at least one part to be treated is formed by an annular reflector (22, 22a) placed in said chamber surrounding said at least one part (1), said annular reflector having an internal diameter and height chosen so that there is no partial occultation of the source (16, 16a) whatever the surface element of said at least one part to be treated (1).

3. Apparatus according to claim 2, characterized in that the annular reflector is formed by a solid toroidal part (22a), whose internal face is reflecting throughout the whole emission spectrum of the lamps (17) and which is fixed to an internal wall of the housing (2) by any appropriate means, so as to ensure an intimate contact between the internal wall of the housing (2) and the external face of the solid toroidal part (22a).

4. Apparatus according to claim 3 characterized in that a coaxial toroidal groove (35) is formed in a wall of the solid toroidal part (22a), which groove communicates with radial distributing orifices (367) allowing at least one appropriate gas to be introduced into the treatment chamber.

5. Apparatus according to claim 3, characterized in that the at least one part to be treated (1) is held in position by support and centering means with respect to the annular reflector.

6. Apparatus according to claim 5, characterized in that the support and centering means is formed by three spherical domed studs (15a, 15b. . . , 15* . . . ) embedded in the housing (2) and making it possible to reduce to a minimum contact with the at least one part to be treated (1) and so to influence as little as possible the thermal exchange to said at least one part, each stud cooperating with a lateral centering stop means (56) projecting upwardly from an external lateral wall of a corresponding stud.

7. Apparatus according to claim 2, characterized in that said annular reflector (22) is formed by a foil (23) whose internal face (24) is reflecting throughout the whole emission spectrum of the lamps (17) and whose annular configuration is obtained by rolling and is maintained by clamping by means of a non-corrodible ring (25) of appropriate thickness.

8. Apparatus according to claims 1 or 2, characterized in that the treatment chamber (4) comprises a means of access to this chamber and a cylindrical, made from silica and entirely polished, having an appropriate diameter and thickness and being interposed between the source (16, 16a) and the at least one part to be treated (1) and whose axis coincides with the optical axis of the source and the axis of the housing, the housing (2) including a seat (6) on which the window (5) bears, said window being held in position by means of a fixing flange (7) which clamps the window against its seat by means of a plurality of screws (12) made from a material having a negligible thermal expansion coefficient, between said seat (6) and the window (5) and between the window and the fixing flange (7) there is disposed, respectively, a seal (9 and 10) respectively made from an appropriate material.

9. Apparatus according to claim 8, characterized in that said means of access to the treatment chamber (4) is formed by the bottom (3a) of said housing, which bottom cooperates with rapid opening and closing means, thus making an increase in the operating rates possible and formed by a mobile plate (38) of a press with which the bottom of the housing is integrally secured, a fixed plate (or bed) (37) of the press being integrally secured with the upper part of the housing (2) by means of rigid columns, and in that sealing between the housing (2) and bottom (3a) is provided by the following means:
   an annular rib (40) projecting from one of the housing (2) and bottom (3a) separation surfaces and to which a pressing force is transmitted through said columns (39),
   a toroidal cavity (41) disposed outside said annular rib (40) and intended for recovering possible gas leaks, the cavity (41) being connected for this to a recover circuit under depression, and
   a seal (42) made from an appropriate material, disposed outside this toroidal cavity (41).

10. Apparatus according to claim 8, characterized in that said means of access to the treatment chamber (4) is formed by the bottom (3) of said housing (2), which bottom is removable and fixed to the housing my means of movable fixing means.

11. Apparatus according to claim 10, characterized in that the moveable fixing means is formed by a plurality of screws (11) made from a material having a negligible thermal expansion coefficient, a seal (8) made from an appropriate material, being disposed between said bottom and said base of the housing.

12. Apparatus according to claim 8, characterized in that it includes thermal conditioning means for limiting temperature rise of the sighting window (5) and formed by a circuit through which passes an appropriate thermostatic controlled fluid, and including conditioning jackets formed in the enclosure, at the periphery of the sighting window (5) and around screws (12) clamping said fixing flange (7).

13. Apparatus according to claims 1 or 2, characterized in that said thermal light source (16) is formed by several parallel rows of "tungsten-halogen" lamps (17), two consecutive lamps in each row being separated by an appropriate pitch and the rows being offset by a half pitch and being disposed at an appropriate distance from each other, which rows of lamps are housed in a metal sheet cowling (18), to which said housing (2) is fixed by any appropriate means (32) and which is cooled by fans (19), and in that the light source (16) cooperates with a reflector (26), reflecting throughout the whole emission spectrum of the lamps (17) housed in said cowling, to improve its light efficiency and is disposed above and about the light source, so that its axis coincides with the optical axis of said light source, this reflector (26) being cooled by circulation of an appropriate fluid.

14. Apparatus according to claims 1 or 2, characterized in that said thermal light source comprises a light box (16a) having a modular structure for varying the thermal treatment of the at least one part (1) and comprising:
   at least one hollow module (43) with polygonal section, defined by lateral and vertical metal walls (44), parallel to and in the vicinity of each wall (44) there being disposed horizontally parallel rows of linear "tungsten-halogen" lamps (17) which pass through two adjacent walls of the module so that bases (45) of the lamps (17) are disposed outside the module (43) and cooling thereof is efficient, two consecutive lamps (17) in each row being separated by an appropriate pitch allowing a lamp to pass therebetween belonging to each of the two adjacent rows of lamps, the width of each wall (44) being defined by the length of the tungsten filament,
   a metal element (46) for closing an upper opening of the at least one module (43) a plurality of modules of the same type superimposed one on the other whose number depends on the power required by the thermal treatment, which element (46) forms a ceiling of the light box (16a), and
   internal faces of side walls (4) and of the ceiling (46) of the light box (16a) being reflecting throughout the emission spectrum of the lamps (17) and each module (43) being cooled by circulation of an appropriate fluid.

15. Apparatus according to claim 14, characterized in that the ceiling (46) of the light box (16a) also cooperates with a row of linear "tungsten-halogen" lamps disposed horizontally and parallel to said ceiling.

16. Apparatus according to claim 14, characterized in that a connecting flange (47) connects the lower module (43) of the light box (16a) to the housing (2), to permit passing from the polygonal section of the module (43) to the circular section of the housing (2), an internal wall of the connecting flange (47) being also reflecting throughout the whole emission spectrum of the lamps (17).

17. Apparatus according to claim 12 further comprising means for adjusting the power of each module, formed by at least one of switching devices and devices for varying the supply voltage of the lamps, which means for adjusting are controlled by a pyrometric probe activated by radiation coming from a lower face of the part to be treated (1), and under control of a computer programmed for compensating for any undesirable variation in the installed power as well as for adapting the thermal treatment to a well defined cycle.

18. Apparatus according to claim 17, characterized in that the radiation activating the pyrometric probe propagates through:
   a first axial duct (49) formed in the bottom (3a) of the housing (2) and opening upwardly into the treatment chamber (4),
   a sighting window (50) for sighting the lower face of the part (1) disposed at the lower part of the axial duct (49), whose axis is aligned with that of the sighting window (50),
   a prism (51) housed in an added part (52), in its turn housed in the bottom (3a) of the housing (2), the radiation being directed from the sighting window (50) towards this prism (51) by a second axial duct (53) formed in said added part (52), and
   an optical fiber (54) disposed at 90° with respect to the axis of the thermal treatment chamber (4), the radiation being directed from the prism (51) towards the optical fiber (54) through a transverse duct (55) perpendicular to said second axial duct (53) and formed, in said added part (52).

19. Apparatus according to claim 18, characterized in that the bottom (3a) of the housing (2) includes thermal conditioning means formed by a circuit through which passes an appropriate thermostat controlled fluid and including a conditioning jacket (57) formed in the bottom (3a) of the housing (2).

* * * * *

UNITED STATES PATENT AND TRADEMARK OFFICE
CERTIFICATE OF CORRECTION

PATENT NO. : 4,857,704
DATED : August 15, 1989
INVENTOR(S) : Jannot, et al.

It is certified that error appears in the above-identified patent and that said Letters Patent is hereby corrected as shown below:

Column 1, line 39, "N:" should be -- N° --.

Column 2, line 16, "apapratus" should be -- apparatus --.

Column 8, line 13, "scuttle" should be -- window --.

Column 8, line 32, "scuttle" should be -- window --.
Column 12, line 61, after "cylindrical" insert
   -- window (5) --.

Column 13, line 32, "my" should be -- by --.

Column 14, line 40, "12" should be -- 14 --.

Signed and Sealed this

Seventeenth Day of July, 1990

Attest:

HARRY F. MANBECK, JR.

*Attesting Officer*          *Commissioner of Patents and Trademarks*